(12) United States Patent
Dijon et al.

(10) Patent No.: US 8,039,380 B2
(45) Date of Patent: Oct. 18, 2011

(54) PROCEDURE FOR OBTAINING NANOTUBE LAYERS OF CARBON WITH CONDUCTOR OR SEMICONDUCTOR SUBSTRATE

(75) Inventors: Jean Dijon, Champagnier (FR); Adeline Fournier, Mont Saint Martin (FR)

(73) Assignee: Commissariat a l'Energie Atomique, Paris (FR)

( * ) Notice: Subject to any disclaimer, the term of this patent is extended or adjusted under 35 U.S.C. 154(b) by 309 days.

(21) Appl. No.: 12/163,184

(22) Filed: Jun. 27, 2008

(65) Prior Publication Data
US 2009/0325377 A1 Dec. 31, 2009

(51) Int. Cl.
H01L 21/20 (2006.01)

(52) U.S. Cl. ........ 438/584; 438/618; 438/642; 438/643; 257/E51.038; 257/E51.04; 977/700; 977/742; 977/855

(58) Field of Classification Search ............. 257/E51.04, 257/E51.038; 977/700, 742, 855; 438/584, 438/618, 642, 643
See application file for complete search history.

(56) References Cited

U.S. PATENT DOCUMENTS

| | | | |
|---|---|---|---|
| 6,699,642 B2 * | 3/2004 | Chung et al. | 430/313 |
| 7,201,627 B2 * | 4/2007 | Ohnuma | 445/50 |
| 2003/0021966 A1 | 1/2003 | Segal et al. | |
| 2003/0179559 A1 | 9/2003 | Engelhardt et al. | |
| 2005/0215049 A1 | 9/2005 | Horibe et al. | |
| 2005/0230270 A1 * | 10/2005 | Ren et al. | 205/777.5 |
| 2007/0248758 A1 * | 10/2007 | Ward et al. | 427/271 |

FOREIGN PATENT DOCUMENTS

| WO | 0030141 A | 5/2000 |
|---|---|---|
| WO | 0161753 A1 | 8/2001 |
| WO | 2005025734 A | 3/2005 |

OTHER PUBLICATIONS

European Search Report, EP 09163710, dated Jul. 28, 2009.
Qian Wen et al., "Oxygen-assisted Synthesis of SWNTs from Methane Decomposition", Nanotechnology, IOP, Bristol, GB, vol. 18, No. 21, pp. 1-6 (May 30, 2007).
Guofang Zhong et al., "Growth Kinetics of 0.5cm Vertically Aligned Single-Walled Carbon Nanotubes", Chem. B. (Letters), 111(8), pp. 1907-1910 (Feb. 6, 2007).

* cited by examiner

*Primary Examiner* — Khiem D Nguyen
(74) *Attorney, Agent, or Firm* — Nixon Peabody LLP

(57) ABSTRACT

The present invention relates to a process for producing a carbon nanotube (CNT) mat on a conductive or semiconductor substrate. According to this process, a catalytic complex comprising at least one metal layer is firstly deposited on said substrate. Said metal layer then undergoes an oxidizing treatment. Finally, carbon nanotubes are grown from the metal layer thus oxidized. The present invention also relates to a process for producing a via using said CNT mat production process.

10 Claims, 6 Drawing Sheets

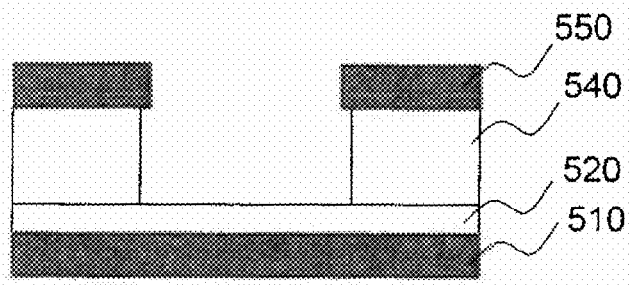
Fig. 5F"
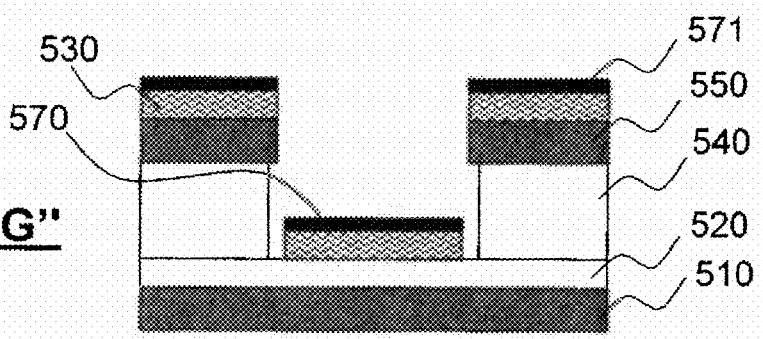
Fig. 5G"
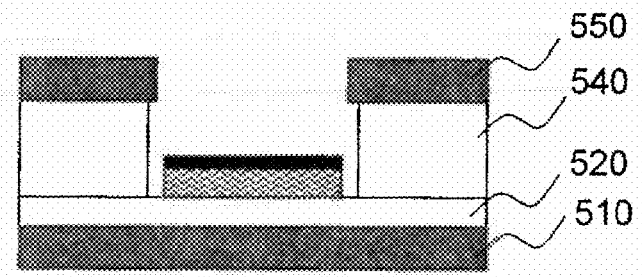
Fig. 5H"
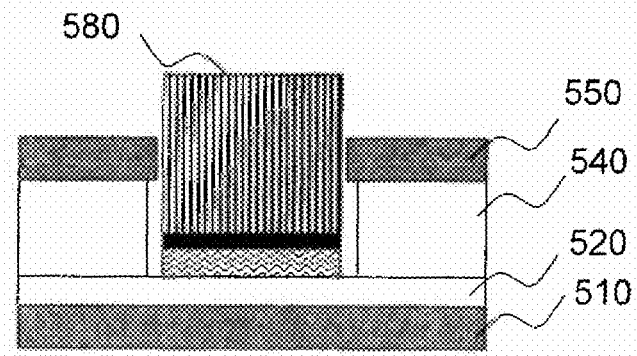
Fig. 5I"

PROCEDURE FOR OBTAINING NANOTUBE LAYERS OF CARBON WITH CONDUCTOR OR SEMICONDUCTOR SUBSTRATE

TECHNICAL FIELD

The present invention relates to the field of carbon nanotubes. It is particularly applicable for the production of vias in integrated circuits.

PRIOR ART

The use of nanotubes for interconnecting various layers of an integrated circuit has recently been the subject of considerable research. Their excellent conducting properties and their electrical and thermal stability mean that carbon nanotubes (CNTs) are excellent candidates for producing vias of very small diameter. An example of a CNT-derived via is described in Application WO 01/61753.

One essential characteristic of a via is its electrical resistance which, when it is based on CNTs, depends on the density of the nanotubes per unit area. In practice, the CNT mat in the via must reach a nanotube density of the order of $10^{11}$ to $10^{13}$ cm$^{-2}$ in order to have an electrical resistance comparable to that of copper. These nanotubes must be connected to the semiconductor substrate or to a conductive layer deposited at the bottom of the via.

The current growth processes for obtaining such CNT densities are all assumed to start from an oxide such as alumina or MgO. For example, the article by G. Zhong and al. entitled "Growth kinetics of 0.5 cm vertically aligned single-walled carbon nanotubes", published in Chem. B. (Letters), 111(8), 1907-1910, [2007], describes a process for growing a mat of SWNTCs (single-walled carbon nanotubes) starting from an alumina layer. More precisely, the Si substrate is coated beforehand with a catalytic sandwich consisting of $Al_2O_3$ (0.5 nm)/Fe (0.5 nm)/$Al_2O_3$ ($\geq$5 nm) by cathode sputtering before the CNTs are grown by PECVO (plasma-enhanced chemical vapour deposition). A pretreatment in a reducing atmosphere during the temperature rise phase of the specimen is necessary in order to form the iron nanoparticles that will initiate the growth of the nanotubes.

The presence of an oxide layer makes the aforementioned growth processes unsuitable for producing interconnections in an integrated circuit.

The object of the present invention is consequently to provide a process for producing a high-density carbon nanotube mat on a conductive or semiconductor material without prior deposition of an oxide layer.

SUMMARY OF THE INVENTION

The present invention is defined by a process for producing a mat of carbon nanotubes on a conductive or semiconductor substrate, which comprises the following steps:
deposition of a catalytic complex, comprising at least one metal layer, on said substrate;
oxidizing treatment of said metal layer; and
growth of carbon nanotubes starting from the metal layer thus oxidized.

Preferably, the oxidizing treatment is carried out by means of an oxidation by a plasma or by a succession of plasmas.

According to a variant, the oxidizing treatment comprises a first oxidation step using a first plasma with a first energy at a first pressure and a second oxidation step using a second plasma with a second energy, lower than said first energy, and at a second pressure higher than said first pressure.

The plasma-induced oxidation is carried out at room temperature.

Advantageously, the catalytic complex comprises a metal layer deposited on an amorphous silicon layer, the amorphous silicon layer being deposited on the conductive substrate.

The substrate may in particular be made of titanium nitride or tantalum nitride, and said metal layer may be made of iron or cobalt.

The invention also relates to a process for producing a via intended for interconnecting first and second conductive layers, which comprises the following steps:
deposition of a diffusion barrier on the first conductive layer;
formation of a catalytic complex, comprising a first amorphous silicon layer and a metal layer on the diffusion barrier, at the bottom of the via;
oxidizing treatment of said metal layer; and
growth of carbon nanotubes starting from the metal layer thus oxidized, the growth time being determined so that the length of the nanotubes is greater than the depth of the via.

Advantageously, the production process further comprises the following steps:
deposition of the amorphous silicon layer on the diffusion barrier;
deposition of a dielectric layer on the amorphous silicon layer followed by deposition of the second conductive layer on the dielectric layer; and
deposition of an etch mask and etching of a via hole down to the amorphous silicon layer.

The step of etching the via hole may be followed by deposition of the metal layer and removal of the mask, the catalytic complex thus being localized at the bottom of the via hole.

Alternatively, the step of etching the via hole may be followed by removal of the mask and deposition of the metal layer, the catalytic complex thus being localized at the bottom of the via hole and the second conductive layer being covered with said metal layer.

According to an embodiment, the process for producing a via comprises the following steps:
deposition of a dielectric layer on the diffusion barrier followed by deposition of the second conductive layer on the dielectric layer;
deposition of an etch mask, etching of a via hole down to the amorphous silicon layer and removal of the mask; and
deposition of the metal layer, followed by chemical-mechanical polishing so as to remove the catalytic complex present on the second conductive layer, the catalytic complex thus being localized at the bottom of the via hole.

Preferably, the metal layer is deposited by means of ion beam sputtering.

Advantageously, the oxidizing treatment is carried out by means of an oxidation by a plasma or by a succession of plasma, at room temperature.

BRIEF DESCRIPTION OF THE DRAWINGS

Other features and advantages of the invention will become apparent on reading a preferred embodiment of the invention, given with reference to the appended figures in which:

FIGS. 5F' to 5H' illustrate certain steps of a process for producing a via according to a first variant of the process illustrated in FIGS. 5A to 5H; and FIGS. 5F''' to 5I'' illustrate certain steps of a process for producing a via according to a second variant of the process illustrated in FIGS. 5A to 5H.

DETAILED DESCRIPTION OF PARTICULAR EMBODIMENTS

Figure 1:
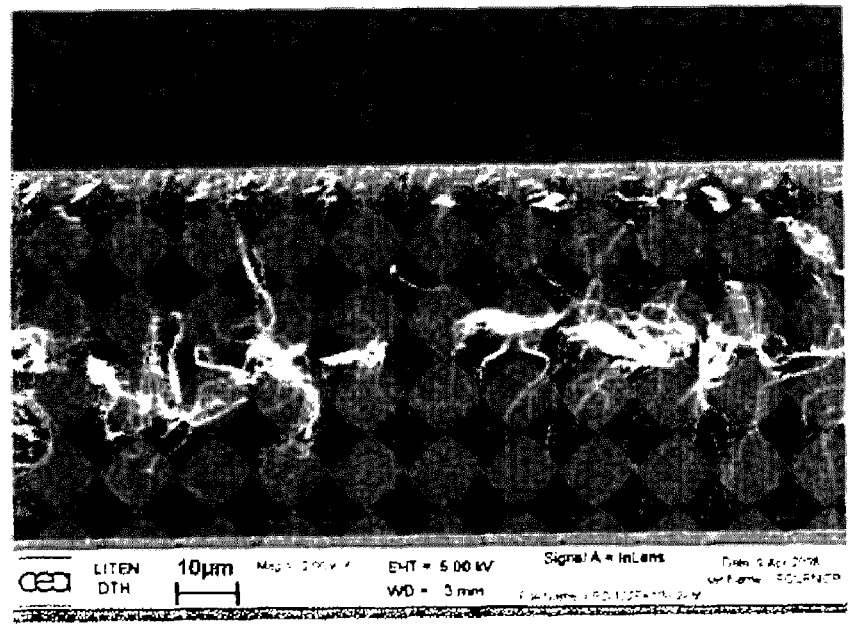
FIG. 1 shows a nanotube mat obtained on a first type of substrate by means of one example of the process according to the invention.

The CNT growth process according to the invention starts from the surprising observation that a prior treatment of the metal catalyst in an oxidizing atmosphere enables the growth of the nanotubes to be initiated.

More precisely, a metal layer serving as growth catalyst, for example a layer of Fe or Co, is firstly deposited on the conductive or semiconductor substrate. The term "substrate" is understood here to mean a substrate on which the nanotubes are grown. In particular, a layer of a conductive or semiconductor material deposited on any substrate, within the general meaning, may itself be termed a conductive or semiconductor substrate.

Next, a treatment in an oxidizing atmosphere is carried out on the specimen before the nanotubes are grown.

In certain cases, it may be advantageous to deposit an amorphous silicon layer on the substrate, prior to deposition of the metal catalyst layer. For example, if the substrate is a material used as diffusion barrier, such as titanium nitride (TiN) or tantalum nitride (TaN), the catalytic system will be a bilayer composed of an amorphous silicon layer a few nanometers, preferably 1 to 10 nm, in thickness, and of a metal layer, with a thickness of around a nanometer to a few nanometers, preferably 0.5 to 5 nm.

The oxidizing treatment may be a treatment in an oxidizing plasma or a succession of oxidizing plasmas, with different compositions and/or under different conditions, such as energy, pressure or temperature. When two successive plasmas are used, the first plasma may be a high-energy plasma and/or a plasma at a lower pressure than the second. For example, a plasma of high energy, preferably between 0.1 and 1 W/cm$^2$, and low pressure, preferably between 0.05 and 1 mbar, may be used, followed by a plasma of low energy, preferably between 0.05 and 0.5 W/cm$^2$, and at higher pressure, for example between 0.2 and 10 mbar.

The gas used for the plasma may be pure oxygen or air, i.e. essentially an oxygen/nitrogen mixture, or else a mixture of oxygen and an inert gas, such as argon, helium or xenon. A person skilled in the art will understand that other oxidizing gases may also be used.

The plasma used is typically a radiofrequency plasma.

In all cases, the oxidizing treatment, and in particular the oxidizing plasma treatment, may be carried out at room temperature or high temperature, for example at a temperature of around 500° C.

The oxidizing treatment of the catalytic system is used to modify the oxidation state of the metal catalyst. It has been demonstrated that, all other things being equal, the oxidation state of the catalyst determines the type of growth—an oxidized state results in rapid growth starting from the base of the nanotubes, while a non-oxidized state results in growth via the top of the nanotubes. Thus, an oxidized metal catalyst preferentially creates new nanotubes starting from the substrate and consequently enables higher densities per unit area to be obtained. The nanotubes obtained may be of the single-walled (SWCNT) or multi-walled (MWCNT) type.

We will give below a few examples of the process for producing a carbon nanotube mat according to the invention.

Example 1

The substrate used was single-crystal silicon deoxidized by argon ion bombardment. The catalytic system consisted of a 1 nm layer of iron deposited on the deoxidized silicon by means of argon ion beam sputtering.

The iron layer then underwent an oxidizing plasma treatment with two successive air plasmas generated at room temperature and at a pressure of 0.4 mbar.

The specimen was placed on the electrode connected to the RF source.

The first plasma with relatively high energy induced a 120 V self-bias voltage on the specimen, enabling it to be bombarded while oxidizing it.

The second plasma with a relatively lower energy induced a 65 V self-bias voltage.

Once the oxidizing treatment had been completed, the specimen was heated to a temperature of 560° C. under a hydrogen partial pressure of 0.2 mbar.

The nanotubes were grown by then introducing a gas mixture consisting of acetylene, helium and hydrogen, with respective flow rates of 10 standard cm$^3$/min, 50 standard cm$^3$/min and 50 standard cm$^3$/min, for 1 h at a pressure of 0.24 mbar, into the reactor. The growth was carried out at a temperature of 560° C.

Under these conditions, a mat of small-diameter (5 nm) nanotubes, 60 μm in length and with a density of $4 \times 10^{11}$ cm$^{-2}$ was obtained, as the SEM micrograph of FIG. 1 shows.

Figure 2:
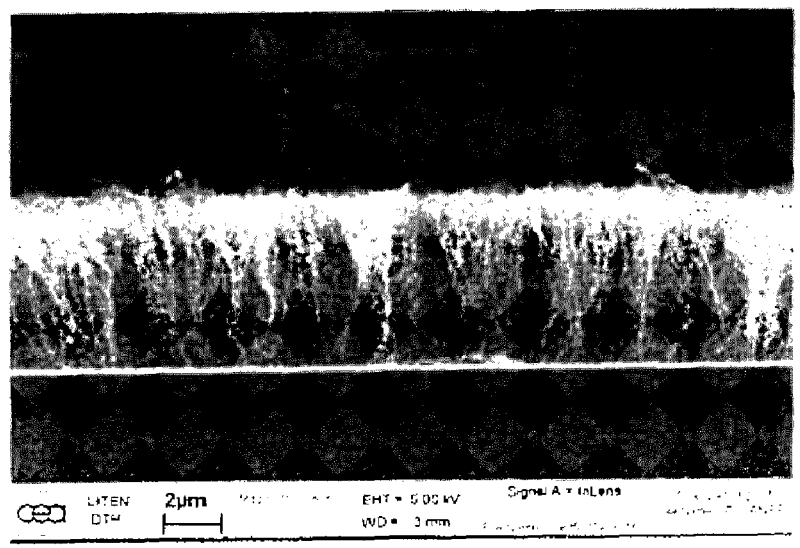
FIG. 2 shows a nanotube mat obtained on this first type of substrate by means of a process known from the prior art.

FIG. 2 shows by comparison a nanotube mat obtained under the same conditions as previously, but with no prior oxidation of the iron layer. The nanotubes are considerably shorter (6 μm) and of larger diameter (12 nm) than in FIG. 1.

Example 2

This example is identical to the previous one except for the type of deposition of the iron layer. After wet etching of the silicon with hydrofluoric acid, the iron layer was deposited by electron-beam evaporation. The rest of the growth process was identical to that of Example 1. The results obtained are similar to those obtained previously.

Example 3

The substrate used was a titanium nitride (TiN) layer. The catalytic system consisted here of a 2 nm iron layer on a 5 nm amorphous silicon layer. The amorphous silicon layer and then the iron layer were deposited by means of ion beam sputtering during the same vacuum cycle.

An oxidizing plasma treatment was then carried out, under the same conditions as those in Example 1, followed by growth of the nanotubes.

Figure 3:
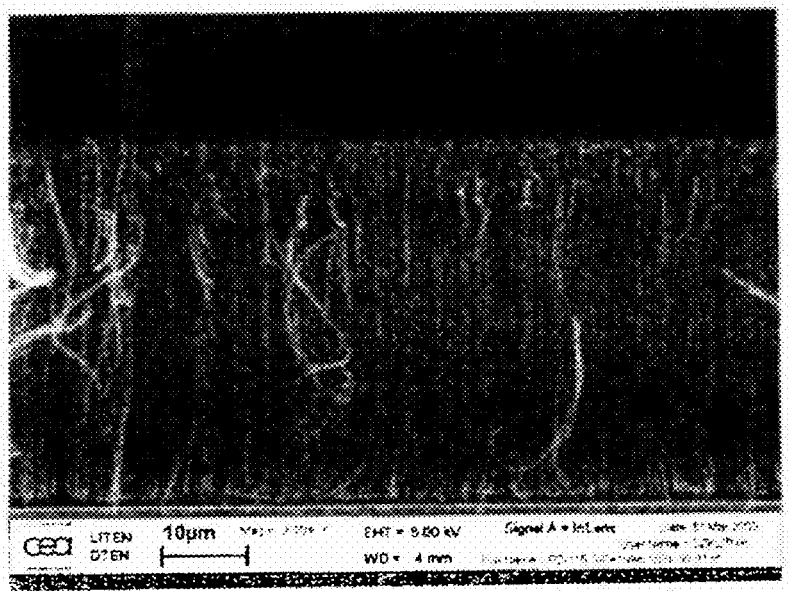
FIG. 3 shows a nanotube mat obtained on a second type of substrate by means of another example of a process according to the invention.

Under these conditions, a dense mat of nanotubes on TiN, having a length of 32 μm and a density of $2 \times 10^{11}$ cm$^{-2}$, as illustrated in FIG. 3, was obtained.

Figure 4:
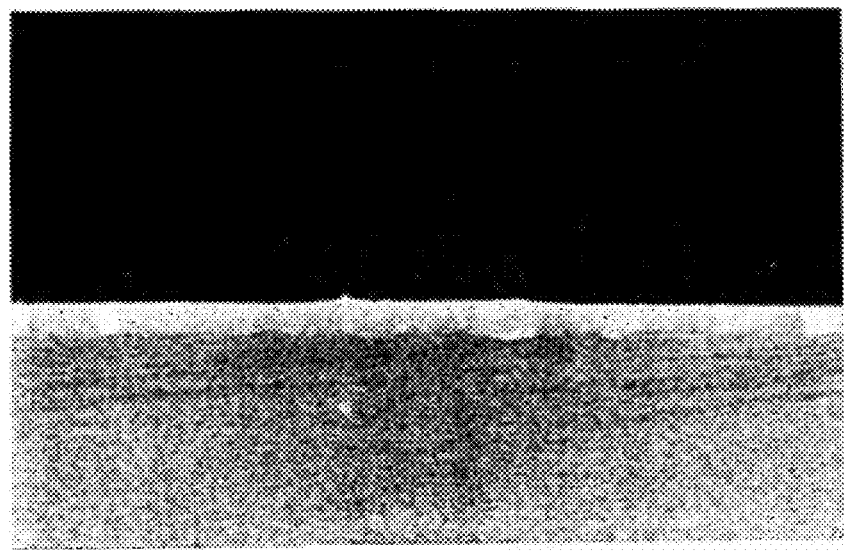
FIG. 4 shows the absence of a nanotube mat on this second type of substrate, using a process known from the prior art.

FIG. 4 shows by comparison the case in which a single iron layer is deposited on the TiN layer without prior oxidizing treatment. The absence of nanotube growth on this layer is therefore observed.

The process for producing a CTN mat according to the invention may be used for the production of interconnect elements, especially vias in an integrated circuit.

FIGS. 5A to 5H show the various steps in producing an interconnect element using the process according to the invention.

Figure 5A:
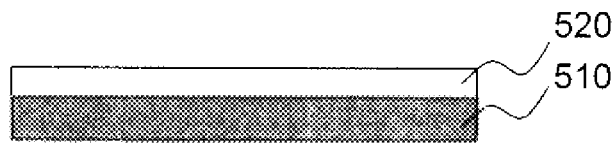
FIGS. 5A to 5H illustrate a process for producing a via according to one embodiment of the invention.

FIG. 5A shows a conductive or semiconductor substrate 510 from which the via has to be produced. As already mentioned earlier, this substrate may be a simple metal layer, for example of Ti, Ta, W, Cu, or else a semiconductor layer, deposited on a bulk substrate (not shown). The substrate 510 is coated with a diffusion barrier 520, for example made of titanium nitride (TiN) or tantalum nitride (TaN). The metal layer and the diffusion barrier are deposited in a manner known per se.

Figure 5B:
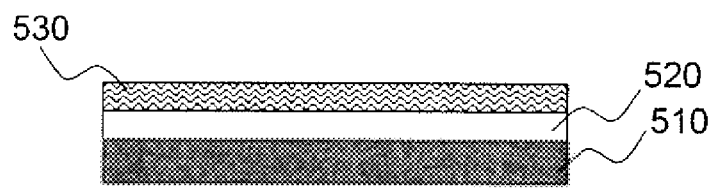

In the next step shown in FIG. 5B, an amorphous silicon layer 530 is deposited on the diffusion barrier 520. The thickness of the layer 530 may be around 5 nm.

Figure 5C:
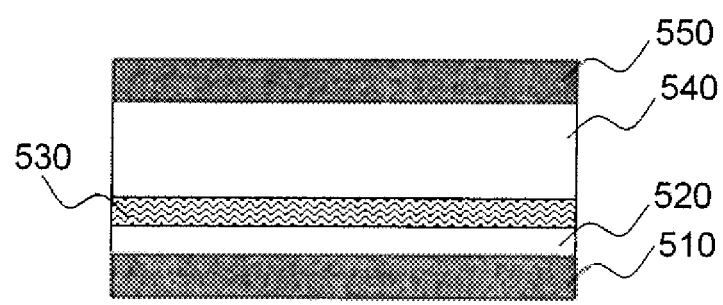

Next, as indicated in FIG. 5C, a dielectric layer 540, for example made of $SiO_2$ or $Si_3N_4$, is deposited on the amorphous silicon layer, followed by a conductive layer 550, for example a TiN layer.

Figure 5D:
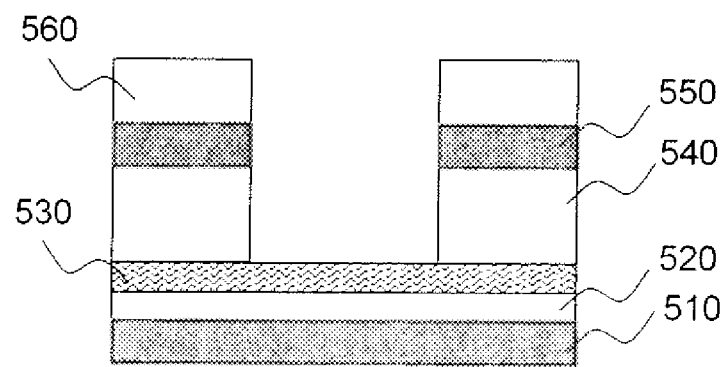

The next step illustrated in FIG. 5D consists in carrying out a masking step, in a conventional manner using a photoresist mask, and then in etching the pattern defined by the mask by means of a dry etching process. The etching is stopped on the amorphous silicon layer 530.

Figure 5E:
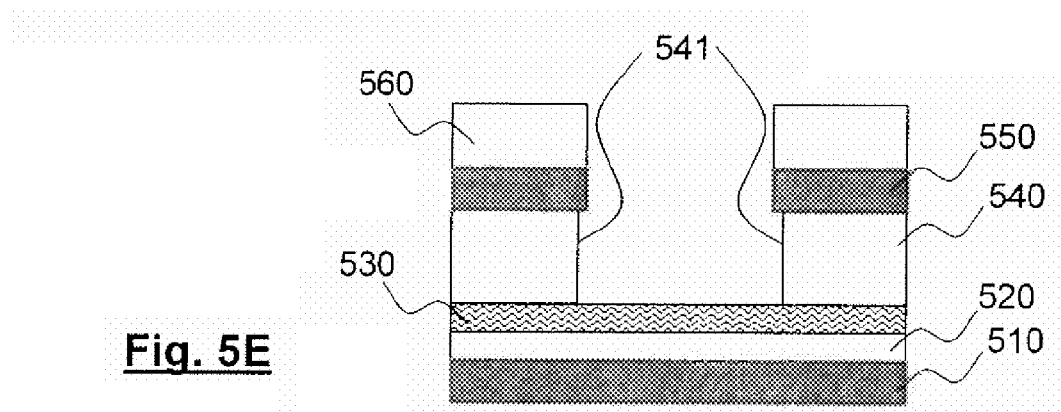

Next, as shown in FIG. 5E, an etching step is carried out in dilute hydrofluoric acid, which enables the amorphous silicon to be deoxidized and the sidewalls 541 of the via to be etched only laterally.

Figure 5F:
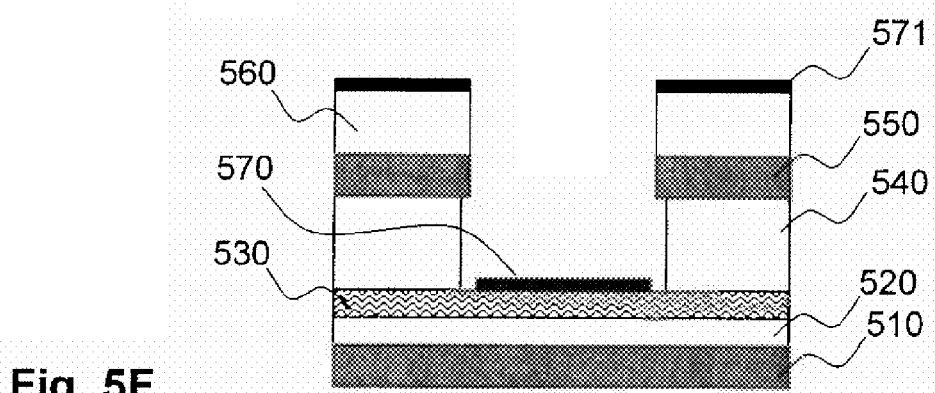

Immediately after this wet etching step, the specimen is returned to vacuum and a metal layer 570, 571, for example a 2 nm layer of iron, is deposited by means of ion beam sputtering, the ion beam being at normal incidence. The shield formed by the mask and the directionality of the beam prevent deposition on the sidewalls of the via, as illustrated in FIG. 5F.

Figure 5G:
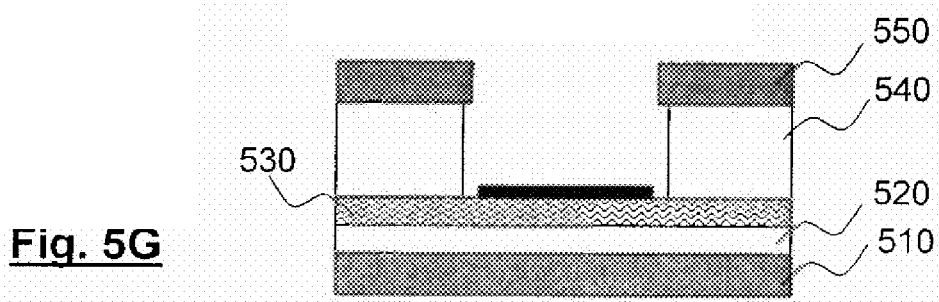

Next, as shown in FIG. 5G, the resin followed by that part 571 of the iron layer deposited on it, are removed and then the oxidation step, for example an oxidation using a plasma or several successive plasmas, is carried out within the same vacuum cycle at room temperature.

Next, the nanotube growth step is carried out within the same vacuum cycle. To do this, the temperature of the specimen is raised and a reactive mixture, for example of acetylene and hydrogen, with helium as carrier gas, is introduced into the chamber. The growth time is determined so that the length of the nanotubes exceeds the depth of the via. The nanotube mat is denoted by 580.

The specimen may then be mechanically polished so that the nanotubes are flush with the surface of the conductive layer 550. Where appropriate, a further metal layer is deposited so as to improve the electrical contact between the layers 520 and 550.

According to a first variant, the process for producing the via starts, as previously, with the steps illustrated in FIGS. 5A to 5E. It then continues with the steps described below.

In FIG. 5F', i.e. after the etching in dilute hydrofluoric acid, the resist mask is removed and then, as indicated in FIG. 5G', a metal layer is deposited, for example a 1 nm layer of iron, and the oxidation step is carried out within the same vacuum cycle.

Next, the nanotubes are growth under the same conditions as previously. The growth takes place only on the iron layer 570, deposited at the bottom of the via and not on the upper layer 571. This is because on a TiN (or TaN) layer, only the catalytic complex consisting of a metal (iron) layer and an amorphous silicon layer enables the nanotubes to be grown.

The production process concludes as previously with a mechanical polishing step in which the upper residual layer 571 is removed and, where appropriate, a further conductive layer is deposited.

According to a second variant, the process for producing the via also starts with the steps illustrated in FIGS. 5A to 5E, except that the amorphous silicon deposition is omitted.

The resulting structure, after etching in dilute hydrofluoric acid and removal of the resist, is illustrated in FIG. 5F". It should be noted that this structure differs from that illustrated in FIG. 5F' by the absence of the amorphous silicon layer.

In FIG. 5G", the amorphous silicon layer 530 and then the metal layer 570, making up the catalytic complex, are deposited within the same vacuum cycle.

In FIG. 5I", a chemical-mechanical polishing operation is carried out on the specimen so as to remove the residual metal layer 571 and amorphous silicon layer 531. The oxidation step is then carried out on the catalytic complex.

Figure 5H:
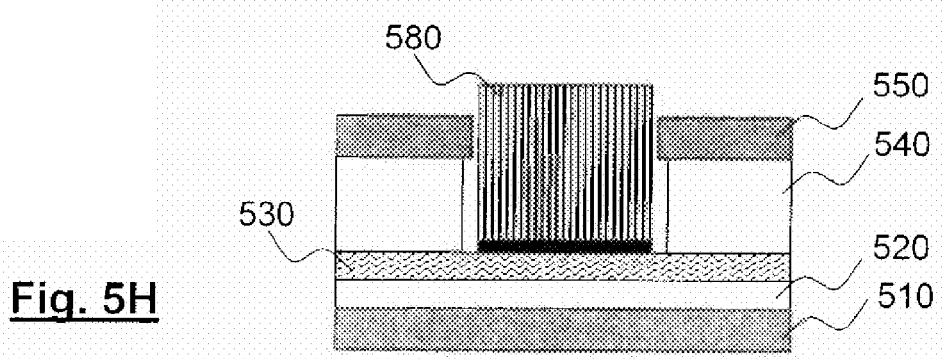
Figure 5F:
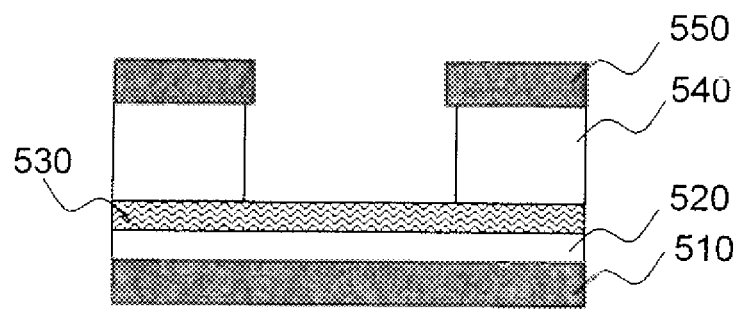
Figure 5G:
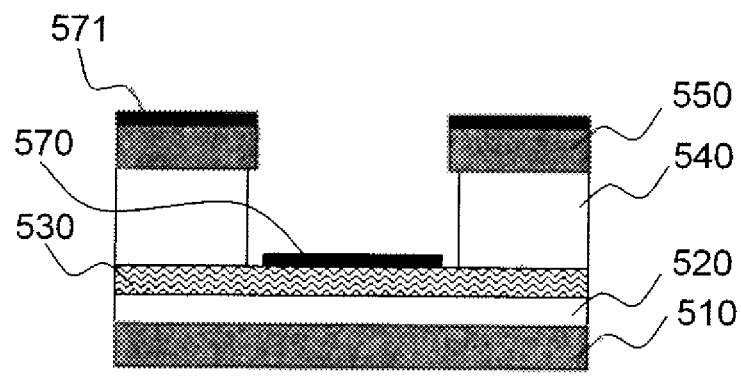
Figure 5H:
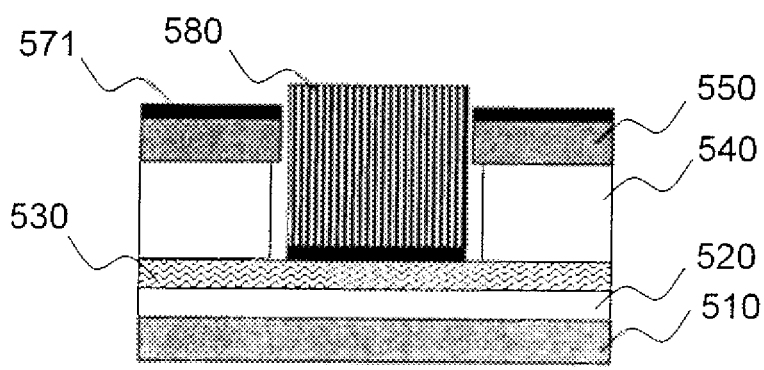

The nanotube growth step illustrated in FIG. 5I" is identical to that of FIG. 5H.

The invention claimed is:

1. Process for producing a mat of carbon nanotubes on a conductive or semiconductor substrate, characterized in that it comprises the following steps:
    deposition of a catalytic complex, comprising at least one metal layer, on said substrate, said catalytic complex comprising a metal layer deposited on an amorphous silicon layer, the amorphous silicon layer being deposited on said substrate;
    oxidizing treatment of said metal layer; and
    growth of carbon nanotubes starting from the metal layer thus oxidized.

2. Production process according to claim 1, characterized in that the substrate is made of titanium nitride or tantalum nitride.

3. Production process according to claim 1, characterized in that said metal layer is made of iron or cobalt.

4. Process for producing a via intended for interconnecting first and second conducting layers, characterized in that it comprises the following steps:
    deposition of a diffusion barrier on the first conductive layer;
    formation of a catalytic complex, comprising a first amorphous silicon layer and a metal layer on the diffusion barrier, at the bottom of the via;
    oxidizing treatment of said metal layer; and
    growth of carbon nanotubes starting from the metal layer thus oxidized, the growth time being determined so that a length of the nanotubes is greater than a depth of the via.

5. Process for producing a via according to claim 4, characterized in that it comprises the following steps:
    deposition of the amorphous silicon layer on the diffusion barrier;
    deposition of a dielectric layer on the amorphous silicon layer followed by deposition of the second conductive layer on the dielectric layer; and
    deposition of an etch mask and etching of a via hole down to the amorphous silicon layer.

6. Process for producing a via according to claim 5, characterized in that the step of etching the via hole is followed by deposition of the metal layer and removal of the mask, the catalytic complex thus being localized at the bottom of the via hole.

7. Process for producing a via according to claim 5, characterized in that the step of etching the via hole is followed by removal of the mask and deposition of the metal layer, the catalytic complex thus being localized at the bottom of the via hole and the second conductive layer being covered with said metal layer.

8. Process for producing a via according, to claim 4, characterized in that it comprises the following steps:
   deposition of a dielectric layer on the diffusion barrier followed by deposition of the second conductive layer on the dielectric layer;
   deposition of an etch mask, etching of a via hole down to the amorphous silicon layer and removal of the mask; and
   deposition of the metal layer, followed by chemical-mechanical polishing so as to remove the catalytic complex present on the second conductive layer, the catalytic complex thus being localized at the bottom of the via hole.

9. Process for producing a via according to claim 4, characterized in that the metal layer is deposited by means of ion beam sputtering.

10. Process for producing a via according to claim 4, characterized in that the oxidizing treatment is carried out by means of an oxidation by a plasma or by a succession of plasma, at room temperature.

* * * * *